(12) United States Patent
Tang et al.

(10) Patent No.: US 11,728,185 B2
(45) Date of Patent: Aug. 15, 2023

(54) STEAM-ASSISTED SINGLE SUBSTRATE CLEANING PROCESS AND APPARATUS

(71) Applicant: Applied Materials, Inc., Santa Clara, CA (US)

(72) Inventors: Jianshe Tang, San Jose, CA (US); Wei Lu, Fremont, CA (US); Haosheng Wu, Santa Clara, CA (US); Taketo Sekine, Santa Clara, CA (US); Shou-Sung Chang, Mountain View, CA (US); Hari N. Soundararajan, Sunnyvale, CA (US); Chad Pollard, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/141,622

(22) Filed: Jan. 5, 2021

(65) Prior Publication Data

US 2022/0216074 A1 Jul. 7, 2022

(51) Int. Cl.
*H01L 21/67* (2006.01)
*H01L 21/02* (2006.01)
(Continued)

(52) U.S. Cl.
CPC ........ *H01L 21/67051* (2013.01); *B08B 3/024* (2013.01); *B08B 3/08* (2013.01); *B08B 3/12* (2013.01); *B08B 5/02* (2013.01); *H01L 21/02057* (2013.01); *H01L 21/30625* (2013.01); *B08B 2203/007* (2013.01); *B08B 2230/01* (2013.01); *H01L 21/02074* (2013.01); *H01L 21/67109* (2013.01)

(58) Field of Classification Search
CPC ......... H01L 21/02057; H01L 21/30625; H01L 21/67109; H01L 21/67051; H01L 21/02074; B08B 3/024; B08B 5/02; B08B 3/12; B08B 3/08; B08B 2230/01; B08B 2203/007
See application file for complete search history.

(56) References Cited

U.S. PATENT DOCUMENTS 5,882,433 A 3/1999 Ueno
5,964,952 A * 10/1999 Kunze-Concewitz ......................
H01L 21/02046
134/103.3

(Continued)

FOREIGN PATENT DOCUMENTS

KR 1020050026175 A 6/2004
KR 1020180135173 A 12/2018
(Continued)

OTHER PUBLICATIONS

International Search Report issued to PCT/US2021/062652 dated Apr. 7, 2022.

*Primary Examiner* — Benjamin L Osterhout
(74) *Attorney, Agent, or Firm* — Patterson + Sheridan, LLP

(57) ABSTRACT

The present disclosure relates to a method and apparatus for cleaning a substrate. The method includes rotating a substrate disposed on a substrate support and spraying a front side of the substrate using steam through a front side nozzle assembly. A back side of the substrate is sprayed using steam through a back side dispenser assembly. A heated chemical is dispensed over the front side of the substrate.

20 Claims, 3 Drawing Sheets

(51) Int. Cl.
*B08B 3/02* (2006.01)
*B08B 3/08* (2006.01)
*B08B 5/02* (2006.01)
*B08B 3/12* (2006.01)
*H01L 21/306* (2006.01)

(56) References Cited

U.S. PATENT DOCUMENTS

| | | | |
|---|---|---|---|
| 6,460,552 B1 * | 10/2002 | Lorimer | H01L 21/67219 134/147 |
| 6,491,764 B2 | 12/2002 | Mertens et al. | |
| 6,610,168 B1 * | 8/2003 | Miki | B08B 3/02 156/704 |
| 6,770,151 B1 | 8/2004 | Ravkin et al. | |
| 6,834,440 B2 | 12/2004 | Lee | |
| 6,890,391 B2 | 5/2005 | Aoki et al. | |
| 6,946,399 B1 * | 9/2005 | Lorimer | H01L 21/0209 438/704 |
| 6,954,993 B1 | 10/2005 | Smith et al. | |
| 7,000,623 B2 | 2/2006 | Welsh et al. | |
| 7,644,512 B1 | 1/2010 | Liu et al. | |
| 7,927,429 B2 | 4/2011 | Nanba et al. | |
| 7,947,637 B2 | 5/2011 | Kneer | |
| 8,056,253 B2 | 11/2011 | Liu et al. | |
| 8,113,221 B2 | 2/2012 | Nanba et al. | |
| 8,276,291 B2 | 10/2012 | Liu et al. | |
| 8,739,429 B2 | 6/2014 | Liu et al. | |
| 8,795,032 B2 | 8/2014 | Miyazaki et al. | |
| 8,857,449 B2 | 10/2014 | Miya | |
| 9,142,399 B2 | 9/2015 | Ishibashi | |
| 9,165,799 B2 | 10/2015 | Wang et al. | |
| 10,518,382 B2 | 12/2019 | Kweon et al. | |
| 2002/0007844 A1 | 1/2002 | Ori et al. | |
| 2002/0020436 A1 * | 2/2002 | Bergman | B08B 3/08 134/28 |
| 2002/0066475 A1 * | 6/2002 | Verhaverbeke | B25B 5/06 134/902 |
| 2003/0192570 A1 | 10/2003 | Thakur et al. | |
| 2003/0192577 A1 | 10/2003 | Thakur et al. | |
| 2004/0040177 A1 | 3/2004 | Izumi | |
| 2004/0045589 A1 | 3/2004 | Holsteyns et al. | |
| 2004/0103915 A1 | 6/2004 | Verhaverbeke et al. | |
| 2004/0144862 A1 | 7/2004 | Boyd et al. | |
| 2005/0178504 A1 | 8/2005 | Speh et al. | |
| 2006/0016458 A1 | 1/2006 | Novak et al. | |
| 2007/0049009 A1 | 3/2007 | Hsu et al. | |
| 2007/0220775 A1 | 9/2007 | Miya | |
| 2007/0246081 A1 | 10/2007 | Lu et al. | |
| 2008/0050679 A1 | 2/2008 | Salek et al. | |
| 2008/0292877 A1 | 11/2008 | Horie et al. | |
| 2008/0295868 A1 | 12/2008 | Nakamura et al. | |
| 2009/0101181 A1 | 4/2009 | Morisawa et al. | |
| 2010/0325913 A1 | 12/2010 | Wang et al. | |
| 2012/0048295 A1 | 3/2012 | Du et al. | |
| 2013/0167947 A1 | 7/2013 | Nakano et al. | |
| 2014/0051259 A1 * | 2/2014 | Shibayama | H01L 21/68792 156/345.23 |
| 2014/0083468 A1 | 3/2014 | Miyazaki et al. | |
| 2014/0283884 A1 | 9/2014 | Liu et al. | |
| 2014/0302676 A1 | 10/2014 | Miyazaki et al. | |
| 2015/0050863 A1 | 2/2015 | Miyazaki et al. | |
| 2015/0052776 A1 | 2/2015 | de Jong | |
| 2015/0111804 A1 | 4/2015 | Dory et al. | |
| 2015/0159124 A1 | 6/2015 | Takahashi et al. | |
| 2015/0159125 A1 | 6/2015 | Kneer | |
| 2015/0267112 A1 | 9/2015 | Dory et al. | |

FOREIGN PATENT DOCUMENTS

| | | |
|---|---|---|
| WO | 2006001117 | 1/2006 |
| WO | 2007084952 A2 | 7/2007 |
| WO | 2008005354 A2 | 1/2008 |
| WO | 2010104816 A1 | 9/2010 |
| WO | 2013133401 A1 | 9/2013 |
| WO | 2015024956 A1 | 2/2015 |
| WO | 2015060954 A1 | 4/2015 |
| WO | 2015084921 A1 | 6/2015 |
| WO | 2015089023 A1 | 6/2015 |
| WO | 2015142778 A1 | 9/2015 |
| WO | 2015145724 A1 | 10/2015 |

\* cited by examiner

STEAM-ASSISTED SINGLE SUBSTRATE CLEANING PROCESS AND APPARATUS

BACKGROUND

Field

Embodiments of the present disclosure generally relate to substrate processing, and more specifically to substrate processing tools and methods thereof.

Description of the Related Art

An integrated circuit is typically formed on a substrate by the sequential deposition of conductive, semiconductive or insulative layers on a silicon substrate. Fabrication includes numerous processes in which the surface of the substrate is cleaned at various stages before the formation of devices can be completed. One common method for cleaning the substrates is referred to as "spin cleaning." Although conventional spin cleaning processes remove process residue and contaminants, a substantial amount of cleaning solution and energy is used to achieve adequate cleaning and can also introduce corrosion during drying of the substrate.

Thus, there is a need for a method and apparatus capable of cleaning substrates at various stages of processing that is efficient and is substantially free of corrosion.

SUMMARY

In one embodiment, a method of cleaning a substrate is provided. The method includes rotating a substrate disposed on a substrate support and spraying a front side of the substrate using steam through a front side nozzle assembly. A back side of the substrate is sprayed using steam through a back side dispenser assembly. A heated chemical is dispensed over the front side of the substrate.

In another embodiment, an apparatus for cleaning a substrate is provided. The apparatus includes a chamber having a substrate support disposed therein. A point of use chemical heating and dispensing nozzle (e.g., POU nozzle) is disposed above the substrate support, and the POU nozzle includes a first conduit configured to be coupled to a fluid source and a second conduit configured to be coupled to a nitrogen source. A front side nozzle assembly is disposed above the substrate support, the front side nozzle assembly configured to be coupled to a first steam source and a first deionized water (DIW) source. A back side dispenser assembly is disposed below the substrate support, the back side dispenser assembly is configured to be coupled to a second steam source and a second DIW source.

In yet another embodiment, a method of processing a substrate is provided. The method includes polishing the substrate using a chemical mechanical planarization (CMP) process. After polishing the substrate, the substrate is disposed on a substrate support and is rotated thereon. A front side of the substrate is heated using steam through a front side nozzle assembly, and a back side of the substrate is heated using steam through a back side dispenser assembly. The method includes dispensing a heated chemical over the front side of the substrate. The front side and the back side of the substrate is rinsed using carbon dioxide dissolved DIW and steam. The substrate is dried by flowing a nitrogen gas over the front side of the substrate and a drying fluid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to an apparatus and method for cleaning a substrate using a single pass cleaning process. Conventional single pass cleaning processes do not raise the substrate temperature high enough to enable effective and economical cleaning. Additionally, other conventional substrate cleaning includes a hot chemical bath for single or multiple substrates which can result in cross contamination, enables decomposition, and needs close monitoring to maintain chemical concentration and levels. The apparatus and method described herein heats a front side, a back side, or both sides of a substrate using steam, uses megasonic or steam jet agitation, and dispenses a point of use solvent or cleaning chemical over the surface of the substrate for effective cleaning. The substrate is rinsed and dried using a process that reduces contamination and corrosion. The apparatus and cleaning method described herein can be used for both front end of line (FEOL) and back end of line (BEOL) post chemical mechanical planarization of substrates. Polished BEOL substrates including metallic materials integrated in the circuits can be exposed to chemical solutions. Thus, to prevent corrosion during cleaning and rinsing substrates with exposed metallic materials in the integrated circuits on the substrate, the substrate is rinsed using carbon dioxide dissolved DIW and steam and is dried by flowing a nitrogen gas over the front side of the substrate and a drying fluid.

Figure 1:
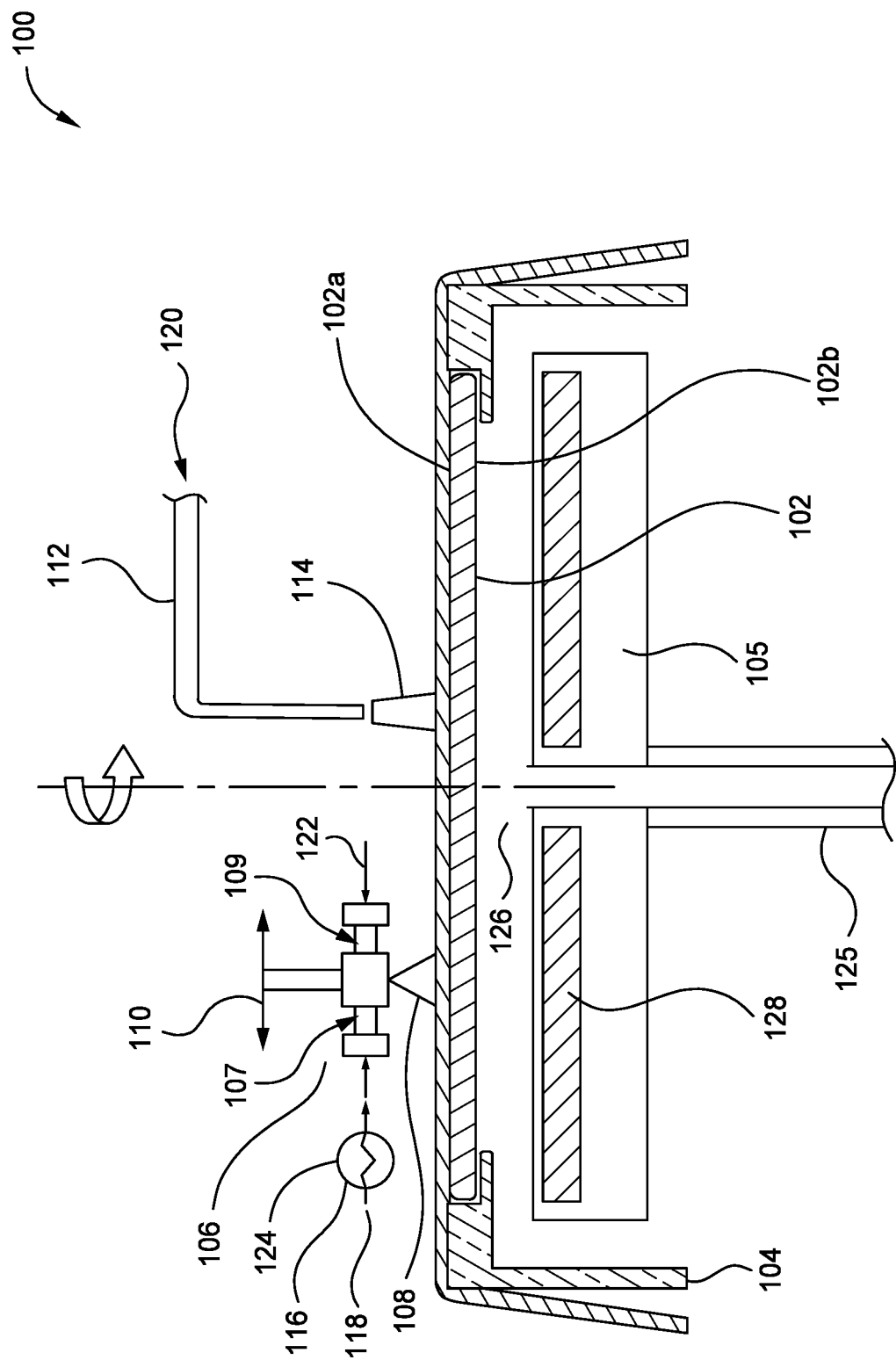
FIG. 1 is a cross-sectional schematic view of a substrate processing apparatus, including a substrate support, a back plate, and a dispense assembly according to an embodiment.

FIG. 1 depicts a cross-sectional schematic view of a substrate processing apparatus 100, including a substrate support 104, a back plate 105, and a cleaning dispense assembly. The substrate support 104 is capable of spinning as further described herein. The back plate 105 is vertically movable or is fixed.

A point of use chemical heating and dispensing nozzle (e.g., POU nozzle) 106 is disposed above a substrate 102 disposed on the substrate support 104. The POU nozzle 106 sprays atomized chemical droplets 108 to actively remove particles or contaminants from the substrate 102 without damaging surface features of the substrate 102. The POU nozzle 106 is moved along a planar axis 110 above the substrate 102. In operation, the POU nozzle 106 sweeps between a center region and a first edge region of the substrate. In some embodiments, micro-droplets are sprayed in a substantially even distribution about the front side 102a of the substrate 102. The POU nozzle 106 includes a first conduit 107 which is coupled to a heat exchanger 116. The heat exchanger 116 is coupled to a steam source 124 and a fluid source 118. The fluid source 118 is de-ionized water (DIW) and/or a cleaning chemical source. The fluid from the fluid source 118 is heated by the steam from the steam source 124 to form a heated fluid (e.g., heated chemical). A second conduit 109 is coupled to the POU nozzle 106 and a nitrogen gas source 122. In operation, the nitrogen gas atomizes the heated fluid and is sprayed on the front side 102a of the substrate 102 (e.g., atomized chemical droplets 108). In some embodiments, the cleaning chemical from the cleaning source is DIW, ammonium hydroxide, hydrogen peroxide, hydrofluoric acid, hydrochloric acid, sulfuric acid, or combination(s) thereof. The POU nozzle 106 is a low volume dispenser, such as an atomizer, which dispenses about 90 mL/min, such as about 20 mL to about 30 mL of cleaning chemical. The POU nozzle 106 provides good surface coverage of the substrate to clean the substrate using low amounts of chemicals. The POU nozzle is movable between a center of the back plate and an outer perimeter of the back plate.

A front side nozzle assembly 112 is disposed over the substrate 102 disposed on the substrate support 104 (e.g., off-center from the center of the substrate) and is capable of spraying de-ionized water (DIW) and/or steam over the front side 102a of the substrate 102 with a jet stream 114. In some embodiments, the front side nozzle assembly 112 releases steam over the front side 102a of the substrate 102 to heat the substrate 102. In some embodiments, the front side nozzle assembly 112 releases DIW to rinse the front side 102a of the substrate 102. In operation, the substrate 102 rotates at about 10 rpm to about 1000 rpm, such as about 500 rpm to about 900 rpm. The front side nozzle assembly 112 is capable of moving along a planar axis above the substrate in a direction between a center of the substrate and an edge of the substrate. The front side nozzle assembly 112 is capable of dispensing DIW at a rinse flow rate of about 800 ml/min to about 2000 ml/min.

A back side dispenser assembly 126 is disposed below the substrate 102 (e.g., centered below the substrate) and is capable of injecting de-ionized water (DIW) and/or steam over the back side 102b of the substrate 102. Fluid is injected through a support liquid channel 125 of the back side dispenser assembly 126 that runs through a central portion of the back plate 105. In some embodiments, the back side dispenser assembly 126 releases steam over the back side 102b of the substrate 102 to heat the substrate 102. In some embodiments, the back side dispenser assembly 126 releases DIW to rinse the back side 102b of the substrate 102. In operation, fluid from the back side dispenser assembly 126 is directed to a center of the back side 102b of the substrate 102 while the substrate 102 is spinning. In some embodiments, which can be combined with other embodiments described herein, fluid is dispensed from the back side dispenser assembly 126 through a single center orifice.

One or more piezoelectric transducers 128 is embedded in the back plate 105 to form a megasonic plate. The megasonic plate is capable of applying megasonic energy to the fluid provided by the back side dispenser assembly 126. In operation, the megasonic energy is coupled from the back side 102b to the front side 102a of the substrate 102 for agitation. It is believed that the megasonic plate provides agitation, which, in combination with the cleaning process described herein dissociates residues and contaminants from substrates 102. In some embodiments, which can be combined with other embodiments described herein, the megasonic energy is applied to fluid between the back plate 105 and back side 102b of the substrate 102 after exiting the back side dispenser assembly 126, as shown in FIG. 1.

Figure 2:
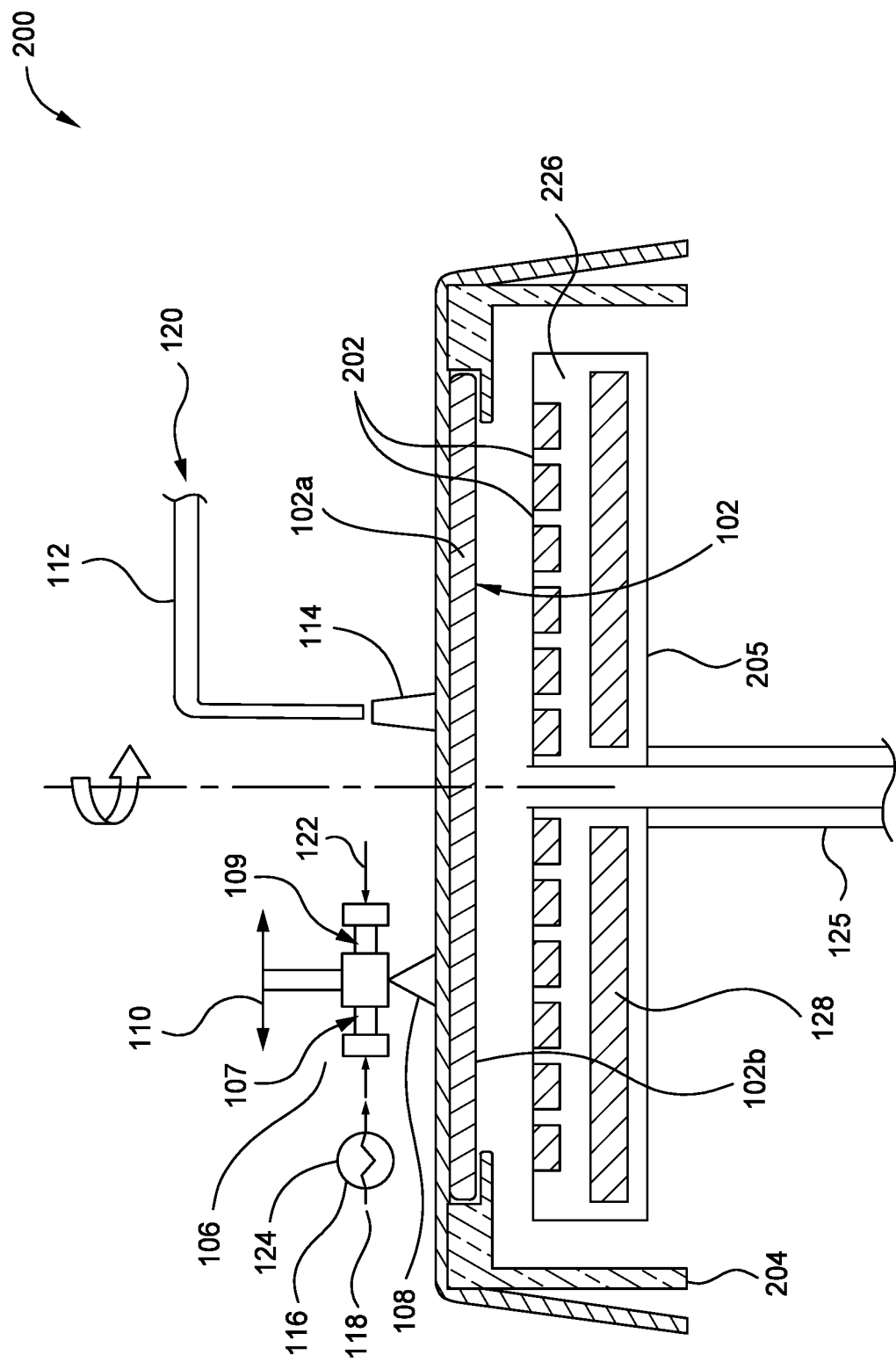
FIG. 2 is a cross-sectional schematic view of a substrate processing apparatus having a plurality of apertures on a back plate according to an embodiment.

FIG. 2 is a cross-sectional schematic view of a substrate processing apparatus 200 having a back side dispenser assembly 226 having a plurality of apertures 202 on a back plate 205 of the substrate processing apparatus. In operation, fluid is injected through channel 125 of the back side dispenser assembly 126 and is directed through a plurality of apertures 202 on the back plate 205 to the back side 102b of the substrate 102. One or more piezoelectric transducers 128 can also be used in combination with the plurality of apertures 202. In some embodiments, which can be combined with other embodiments described herein, megasonic energy is applied to fluid within the back side dispenser assembly 226 before exiting the back side dispenser assembly 226, as shown in FIG. 2. Alternatively, or additionally, megasonic energy is applied to fluid on the front side of the substrate.

Figure 3:
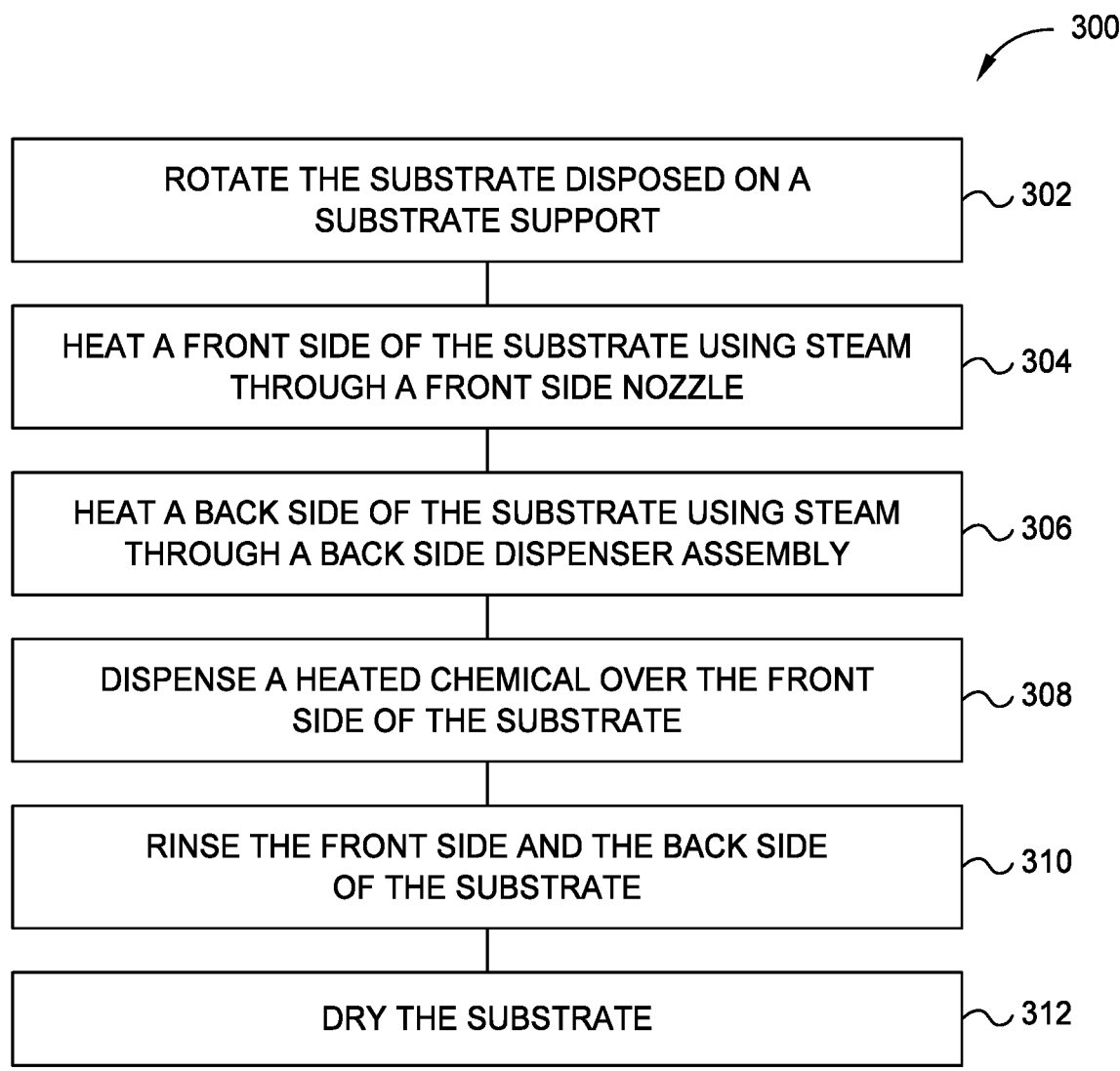
FIG. 3 is a process flow diagram of a method for processing a substrate according to an embodiment.

FIG. 3 is a process flow diagram of a method 300 for processing a substrate 102 according to an embodiment. In operation 302, a substrate 102 disposed on a substrate support 204 is rotated. The substrate 102 is positioned on a single substrate spin station as shown in FIG. 1 and FIG. 2. While the substrate is rotated, a front side 102a of the substrate 102 is heated using steam from a front side nozzle assembly 112 in operation 304. Alternatively, or additionally, a back side 102b of the substrate 102 is heated using steam from a back side dispenser assembly 126 in operation 306. In some embodiments, operation 304 occurs prior to operation 306, operations 304 and 306 occur simultaneously relative to one another, and/or operation 306 occurs prior to operation 304. The substrate 102 is heated to a predetermined temperature range, such as about 90° C. to about 140° C. In some embodiments, a total time from positioning the substrate in operation 302 to heating the substrate 102 to the predetermined temperature range is less than 10 seconds, such as about 4 seconds to about 6 seconds.

The back side dispenser assembly 126 and the front side nozzle assembly 112 releases steam to maintain the temperature of the substrate 102 within a predetermined range during processing. The predetermined range is determined based on a temperature at which a cleaning chemical reaction occurs based on the chemicals selected for cleaning the substrate. A cleaning chemical or chemical mixture is selected from DIW, ammonium hydroxide, hydrogen peroxide, hydrofluoric acid, sulfuric acid, or combination(s) thereof. In some embodiments, the cleaning mixture is a mixture of sulfuric acid and hydrogen peroxides. In some embodiments, the cleaning mixture is a mixture of ammonium hydroxide and hydrogen peroxide. In some embodiments, the cleaning mixture is a mixture of hydrochloric acid and hydrogen peroxide. In some embodiments, point of use chemical heating heats up chemicals being dispensed onto the substrate and minimizes decomposition of the cleaning chemicals. In conventional processes, such as in conventional batch or tank cleaning processes, cleaning chemicals are maintained at elevated temperatures which can decompose the cleaning chemicals. It has been discovered that using point of use chemical heating, less cleaning is lost to decomposition. Preheating the substrate before introducing the cleaning chemicals reduces temperature drop of the cleaning chemicals upon contact with the substrate, and reduces the amount of time needed for effective cleaning. The use of steam instead of hot DIW to heat the substrate, reduces the amount of DIW used and reduces the amount of time used to heat the substrate. Additionally, the use of steam instead of hot DIW further enables heating and agitation during the chemical cleaning process with minimal chemical dilution.

In operation 308, a heated cleaning chemical is disposed over the substrate 102 through a POU nozzle 106. The cleaning chemical is premixed and supplied from a cleaning chemical source 118 and heated using steam in the POU nozzle 106 prior to dispensing the heated cleaning chemical over the substrate 102. Preheating the chemicals in the POU nozzle before introducing the cleaning chemicals reduces decomposition of the cleaning chemicals upon contact with the substrate, and reduces the amount of chemicals used for effective cleaning. In some embodiments, nitrogen gas is injected in the POU nozzle 106 from a nitrogen gas source 122 and atomizes the heated cleaning chemical and/or DIW. In some embodiments, the nitrogen gas source is not used during operation 308. In some embodiments, about 60 mL/min to about 150 mL/min, such as about 90 mL/min of chemicals is dispensed to cover the front side 102a surface of the substrate 102. The chemicals are disposed while the POU nozzle 106 is stationary, or the POU nozzle 106 moves along the planar axis 110 while dispensing. Steam from one or more of the front side nozzle assembly 112 and the back side dispenser assembly 126 is continuously supplied to the substrate during operation 308 to maintain a temperature for continued chemical reaction of the cleaning chemicals.

Acoustic cavitation, such as from megasonic energy, is applied from the back plate 105 and/or an acoustic source generator is coupled to one or more nozzles to provide agitation to the cleaning chemicals and steam for residue and particle removal. Acoustic cavitation includes ultrasonically or megasonically energizing the fluid to dislodge residue and debris. Acoustically energizing fluid uses a piezoelectric transducer (PZT) operating in a frequency range from a lower ultrasonic range (e.g., about 20 KHz) to an upper megasonic range (e.g., about 2 MHz). Other frequency ranges can be used. The shape of a suitable acoustic energy source generator (e.g., a PZT) is rectangular. It has been discovered that heating the substrate before introducing the cleaning chemistry enables the use of low volume cleaning chemicals and enables effective cleaning because the chemicals are introduced into a temperature environment that is already conducive for chemical reaction.

In operation 310, the front side 102a and the back side 102b of the substrate 102 is rinsed using heated DIW supplied from the front side nozzle assembly 112 and the back side dispenser assembly 126. In some embodiments, the front side nozzle assembly 112 and the back side dispenser assembly 126 each include multiple nozzles capable of dispensing steam and DIW simultaneously. During rinsing, steam and DIW are dispensed simultaneously through the front side nozzle assembly 112 and the back side dispenser assembly 126. Rinsing the substrate rinses away any dislodged residue and debris. The substrate continues to rotate during all operations described herein.

Operations 302 to 310 are used at, and/or between each stage of processing the substrate 102, such as front-end-of-line (FEOL) cleaning. For back-end-of-line (BEOL) processing, nitrogen is used to atomize steam-heated DIW in operation 310. In particular, BEOL processing occurs after polishing the substrate in CMP processing. The steam heated DIW used in the back side and front side nozzles described herein produces a reduced DIW surface tension which is efficiently atomized using less nitrogen gas. The energetic jet spray is capable of dislodging particles on the substrate surfaces 102a, 102b. In some embodiments, operations 302 to 310 are completed in less than 120 seconds, such as less than 90 seconds, such as less than 60 seconds.

In operation 312, the substrate 102 is dried. In some embodiments, the substrate is dried in less than 30 seconds. Drying the substrate 102 includes drying using a Rotagoni process. As used herein, a "Rotagoni Process" includes pulling fluids away from the surfaces of the substrate 102 using a surface tension gradient formed at the mixing front between a low surface tension fluid, such as IPA, and a high surface tension water. The surface tension can be reduced using isopropyl alcohol (IPA) spray or vapor, or any suitable spray or vapor that reduces surface tension of water that is dissolved therein. In some embodiments, the IPA is heated up to further reduce the surface tension of the IPA prior to applying to the substrate. In some embodiments, IPA is mixed with nitrogen to provide an IPA vapor and $N_2$ mixture to be dispensed over the substrate. Additionally, the Rotagoni Process and steam process used herein, quickly vaporizes the thin IPA film, that has replaced water film over the substrate using a low rotation rate of about 300 rpm to about 500 rpm, and thus dries the cleaned substrate.

The process prevents particle or residue from remaining on the substrate in some conventional processes directed to spin-drying by water film vaporization. For steam assisted wet cleaning of BEOL post-CMP substrates, such as post copper CMP cleaning, cleaning efficiency in removing particles and organic residues is often balanced with preventing potential metal corrosion. To prevent metal corrosion, exposure of clean metal surfaces to oxygen present in the rinsing water and air flow should be limited, particularly while the substrate temperatures are high. The Rotagoni Process includes providing an $N_2$ blanket over the substrate while the substrate is at an elevated temperature which prevents moisture from recondensing on the substrate surface, which displaces oxygen in the environment and reduces the relative humidity around the substrate surface. Furthermore, DIW can be degassed and regassed with $CO_2$ for post cleaning rinses, such as in operation 310 described herein. Corrosion is thus reduced without compromising cleaning efficiency. In some embodiments, the elevated substrate temperature during the Rotagoni Process is about 25° C. to about 40° C., such as about 30° C.

Thus, the present disclosure relates to a substrate cleaning method and apparatus configured to heat the substrate (e.g., using steam) to a predetermined temperature suitable for chemical reactions used to clean the substrate. The steam is provided on both the back and front side of the substrate for rapid heating. A heated chemical is dispensed in low quantities to the heated substrate to efficiently clean the substrate without using high volumes of cleaning chemicals. The process includes rinsing the substrate using steam and DIW on the front and back side of the substrate. The substrate is dried using a Rotagoni drying process to prevent corrosion, particles and residue.

What is claimed is:

1. An apparatus for cleaning a substrate comprising:
   a chamber having a substrate support and a back plate disposed therein;
   a point of use (POU) nozzle disposed above the substrate support, the POU nozzle comprising a first conduit configured to be coupled to a fluid source and a second conduit configured to be coupled to a nitrogen source;
   a front side nozzle assembly disposed above the substrate support, the front side nozzle assembly configured to be coupled to a first steam source and a first deionized water (DIW) source; and a back side dispenser assembly disposed below the substrate support, the back side dispenser assembly configured to be coupled to a second steam source and a second DIW source.

2. The apparatus of claim 1, wherein the back plate comprises a center opening, wherein the center opening is in fluid communication with an orifice of the back side dispenser assembly.

3. The apparatus of claim 1, wherein the back plate comprises a plurality of apertures, wherein each of the plurality of apertures are in fluid communication with an orifice of the back side dispenser assembly.

4. The apparatus of claim 1, wherein the back plate comprises one or more vibrating transducer elements.

5. The apparatus of claim 1, wherein the first conduit of the POU nozzle is coupled to a heat exchanger, wherein the heat exchanger comprises steam configured to heat a cleaning fluid from the fluid source.

6. The apparatus of claim 1, wherein the POU nozzle is movable between a center of the back plate and an outer perimeter of the back plate.

7. The apparatus of claim 1, wherein the front side nozzle assembly is capable of heating a front side of the substrate using the steam.

8. An apparatus for cleaning a substrate comprising:
a chamber having a substrate support and a back plate disposed therein;
a point of use (POU) nozzle disposed over the substrate support, the POU nozzle being movable between a center of the back plate and an outer perimeter of the back plate a;
a front side nozzle assembly disposed over a surface of the substrate support at an off center position relative to a center of the substrate support, the front side nozzle assembly configured to be coupled to a first steam source and a first deionized water (DIW) source; and
a back side dispenser assembly is positioned to dispense a fluid to a back side of the substrate when the substrate is disposed on the surface of the substrate support, the back side dispenser assembly configured to be coupled to the first steam source or a second steam source, and the first DIW source or a second DIW source.

9. The apparatus of claim 8, wherein the POU nozzle comprises a first conduit configured to be coupled to a fluid source and a second conduit configured to be coupled to a nitrogen source.

10. The apparatus of claim 9, wherein the first conduit is coupled to a heat exchanger capable of heating fluid provided from the fluid source.

11. The apparatus of claim 8, wherein the POU nozzle is an atomizer.

12. The apparatus of claim 8, wherein the back plate comprises a transducer, wherein the transducer is configured to apply megasonic energy to the fluid being dispensed to the back side of the substrate when the substrate is disposed on the substrate support.

13. The apparatus of claim 8, wherein the back side dispenser assembly is configured to apply megasonic energy to the fluid being dispensed to the surface of the substrate support.

14. The apparatus of claim 8, wherein a piezoelectric transducer is coupled to the back side dispenser assembly and configured to operate at a frequency of about 20 KHz to about 2 MHz.

15. An apparatus for cleaning a substrate comprising:
a chamber having a substrate support and a back plate disposed therein;
an atomizer disposed over the substrate support, the atomizer capable of dispensing atomized fluid over a front side of the substrate support;
a front side nozzle assembly disposed over the substrate support at an off center position relative to a center of the substrate support, the front side nozzle assembly configured to dispense a fluid over the front side of the substrate support; and
a back side dispenser assembly positioned to dispense a fluid to a back side of a substrate when the substrate is disposed on the surface of the substrate support, the back side dispenser assembly comprising a back plate comprising a plurality of apertures, the plurality of apertures in fluid communication with the back side of the substrate when the substrate is disposed on the surface of the substrate support.

16. The apparatus of claim 15, wherein the back side dispenser comprises a plurality of nozzles capable of dispensing steam and deionized water simultaneously.

17. The apparatus of claim 15, wherein the back side plate further comprises megasonic elements.

18. The apparatus of claim 15, wherein the back plate is vertically movable.

19. The apparatus of claim 15, wherein the front side assembly is capable of moving over the surface of the substrate between a center of the substrate support and an edge of the substrate when a substrate is present during processing.

20. The apparatus of claim 15, wherein the front side nozzle assembly is capable of dispensing DIW at a flow rate of about 800 mL/min to about 2000 mL/min.

* * * * *